United States Patent
Kondo et al.

(10) Patent No.: US 10,130,017 B2
(45) Date of Patent: Nov. 13, 2018

(54) DEVICE PROVIDED WITH ELECTROMAGNETIC INTERFERENCE SUPPRESSION BODY

(71) Applicant: TOKIN CORPORATION, Sendai-shi, Miyagi (JP)

(72) Inventors: Koichi Kondo, Sendai (JP); Toshiaki Oka, Sendai (JP); Shigeyoshi Yoshida, Sendai (JP); Masashi Ikeda, Sendai (JP)

(73) Assignee: TOKIN CORPORATION, Sendai-Shi, Miyagi (JP)

( * ) Notice: Subject to any disclaimer, the term of this patent is extended or adjusted under 35 U.S.C. 154(b) by 0 days.

(21) Appl. No.: 15/535,700

(22) PCT Filed: Aug. 3, 2015

(86) PCT No.: PCT/JP2015/071908
§ 371 (c)(1),
(2) Date: Jun. 13, 2017

(87) PCT Pub. No.: WO2016/098377
PCT Pub. Date: Jun. 23, 2016

(65) Prior Publication Data
US 2018/0020580 A1    Jan. 18, 2018

(30) Foreign Application Priority Data

Dec. 17, 2014  (JP) ................................. 2014-255516
Dec. 17, 2014  (JP) ................................. 2014-255517

(51) Int. Cl.
*H05K 9/00*       (2006.01)
*H01F 1/153*      (2006.01)
*H05K 1/02*       (2006.01)

(52) U.S. Cl.
CPC ........... *H05K 9/0081* (2013.01); *H01F 1/153* (2013.01); *H05K 1/0216* (2013.01);
(Continued)

(58) Field of Classification Search
CPC .......................... H05K 9/0083; H05K 9/0086
See application file for complete search history.

(56) References Cited

U.S. PATENT DOCUMENTS

2009/0017279 A1    1/2009   Mizushima et al.

FOREIGN PATENT DOCUMENTS

JP        07086784 A    3/1995
JP        10173388 A    6/1998
(Continued)

OTHER PUBLICATIONS

English translation (machine translation) for JP 2013-30596 (Application No. 2011-165230) on Jan. 30, 2017, 16 pages.*
(Continued)

*Primary Examiner* — Hung V Ngo
(74) *Attorney, Agent, or Firm* — Holtz, Holtz & Volek PC

(57) ABSTRACT

A device is provided with a potential noise radiating source capable of radiating potential noise, a potential noise receiving portion capable of receiving the potential noise and an electromagnetic interference suppression body. The electromagnetic interference suppression body is made by binding flaky soft magnetic metal powder with a binding component and has a sheet-like shape. The electromagnetic interference suppression body is formed with a plurality of slits. The electromagnetic interference suppression body is provided to straddle the potential noise radiating source and the potential noise receiving portion.

9 Claims, 3 Drawing Sheets

(52) U.S. Cl.
CPC ......... *H05K 1/0218* (2013.01); *H05K 9/0083* (2013.01); *H05K 9/0086* (2013.01); *H05K 2201/0715* (2013.01); *H05K 2201/083* (2013.01)

(56) References Cited

FOREIGN PATENT DOCUMENTS

| | | |
|---|---|---|
| JP | 11118732 A | 4/1999 |
| JP | 2001035711 A | 2/2001 |
| JP | 2002151883 A | 5/2002 |
| JP | 2009021403 A | 1/2009 |
| JP | 2011049406 A | 3/2011 |
| JP | 2013004947 A | 1/2013 |
| JP | 2013030596 A | 2/2013 |
| JP | 2014199862 A | 10/2014 |

OTHER PUBLICATIONS

International Search Report (ISR) and Written Opinion dated Oct. 27, 2015 issued in International Application No. PCT/JP2015/071908.

Japanese Office Action (and English language translation thereof) dated Aug. 29, 2018 issued in Japanese Application No. 2014-255516.

Japanese Office Action (and English language translation thereof) dated Aug. 29, 2018 issued in Japanese Application No. 2014-255517.

\* cited by examiner

DEVICE PROVIDED WITH ELECTROMAGNETIC INTERFERENCE SUPPRESSION BODY

TECHNICAL FIELD

This invention relates to a device which is provided with an electromagnetic interference suppression body made by binding flaky soft magnetic metal powder with a binding component and having a sheet-like shape.

BACKGROUND ART

As an electromagnetic interference suppression body of this type, for example, there is one disclosed in Patent Document 1. In a surface of the electromagnetic interference suppression body of Patent Document 1, cuts are made so as to draw broken lines in order to give the electromagnetic interference suppression body flexibility.

PRIOR ART DOCUMENTS

Patent Document(s)

Patent Document 1: JPA2011-49406

SUMMARY OF INVENTION

Technical Problem

This invention aims to provide a new utilization of an electromagnetic interference suppression body like that mentioned above and a device provided with a structure based thereon.

Solution to Problem

The inventors of the present invention discovered the following points as results of studies. 1) In a case, such as a case of two transmission lines, where one of two is a potential noise radiating source possible to radiate a potential noise while the other is a potential noise receiving portion possible to receive the potential noise (one affects the other) it is possible to suppress interference from one to the other by disposing an electromagnetic interference suppression body to straddle the potential noise radiating source and the potential noise receiving portion. 2) There is a case where an interference suppression effect cannot be obtained according to a frequency in a case where an electromagnetic interference suppression body has no slit. However, forming slits makes possible to obtain the interference suppression effect over a relatively wide frequency.

The inventors of the present invention presumed as follows on the basis of the results of the studies. a) The aforementioned electromagnetic interference suppression body has a relatively high dielectric constant in an in-plane direction. b) An electric field is induced into the electromagnetic interference suppression body due to the high dielectric constant. Then, there is possibility that the potential noise source and the potential noise receiving portion are coupled with each other by the electric field. c) When the slits are formed, the electric field is divided and thereby suppressing the aforementioned coupling caused by the electric field. d) When the slits are formed in the electromagnetic interference suppression body so that an effective dielectric constant in the in-plane direction becomes 500 or less (or when many slits are formed), the aforementioned coupling suppression result can be more certainly obtained. From this, it is expected that the presumption is proper.

On the other hand, one of intended uses of the electromagnetic interference suppression body is to remove conductive noise which is transmitted on a signal line along with a signal. Specifically, in order to remove the conductive noise, the electromagnetic interference suppression body is affixed on the signal line of a circuit substrate. The electromagnetic interference suppression body of Patent Document 1 can be appropriately affixed to the object, even in a case where the object has projections and depressions. The conductive noise can be removed by affixing the electromagnetic interference suppression body on the signal line. However, there is a case where radiated noise is increased to the contrary according to a frequency of the signal transmitted on the signal line in comparison with before the electromagnetic interference suppression body is affixed. The inventors of the present invention also presumed that an electric field was induced due to the high dielectric constant of the electromagnetic interference suppression body and therefore the radiated noise was increased according to the frequency. According to this presumption, it is possible to suppress the radiated noise by forming the slits in the electromagnetic interference suppression body to divide the electric field induced in the in-plane direction. That is, when the electric field induced in the in-plane direction is appropriately divided by forming the slits, a spread of the electric field to a periphery of the circuit substrate can be suppressed, and increase of the radiated noise can be suppressed by suppressing increase of common mode current induced in the circuit substrate. As a result of experimenting and studying, it was found that effects such as aforementioned effects were obtained by forming slits until the effective dielectric constant in the in-plane direction becomes 500 or less (i.e. by forming many slits).

The present invention is based on the aforementioned presumptions and findings and specifically provides an electromagnetic interference suppression body enumerated below and a circuit substrate.

An aspect of the present invention provides, as a first device, a device which includes a potential noise radiating source possible to radiate a potential noise, a potential noise receiving portion possible to receive the potential noise and an electromagnetic interference suppression body. The electromagnetic interference suppression body is made by binding flaky soft magnetic metal powder with a binding component and has a sheet-like shape. The electromagnetic interference suppression body is formed with a plurality of slits. The electromagnetic interference suppression body is provided to straddle the potential noise radiating source and the potential noise receiving portion.

Moreover, another aspect of the present invention provides, as a first electromagnetic interference suppression body, an electromagnetic interference suppression body which is disposed on a signal line. The electromagnetic interference suppression body is made by binding flaky soft magnetic metal powder with a binding component and has a sheet-like shape. The electromagnetic interference suppression body is formed with a plurality of slits so that an effective dielectric constant in an in-plane direction becomes 500 or less.

Still another aspect of the present invention provides a second device which has a signal line and is formed by disposing the aforementioned first electromagnetic interference suppression body on the signal line.

Advantageous Effects of Invention

According to the present invention, an electric field caused in the electromagnetic interference suppression body is divided by slits, and coupling of the potential noise radiating source and the potential noise receiving portion with each other can be suppressed within a wide frequency band.

Moreover, according to the present invention, the electric field caused in the electromagnetic interference suppression body is divided by the slits, and increase of a common mode current induced in the circuit substrate on which the signal line is formed can be suppressed, and therefor increase of radiated noise can be suppressed while electromagnetic interference can be suppressed within a wide frequency range.

An appreciation of the objectives of the present invention and a more complete understanding of its structure may be had by studying the following description of the preferred embodiment and by referring to the accompanying drawings.

DESCRIPTION OF EMBODIMENTS

Figure 1:
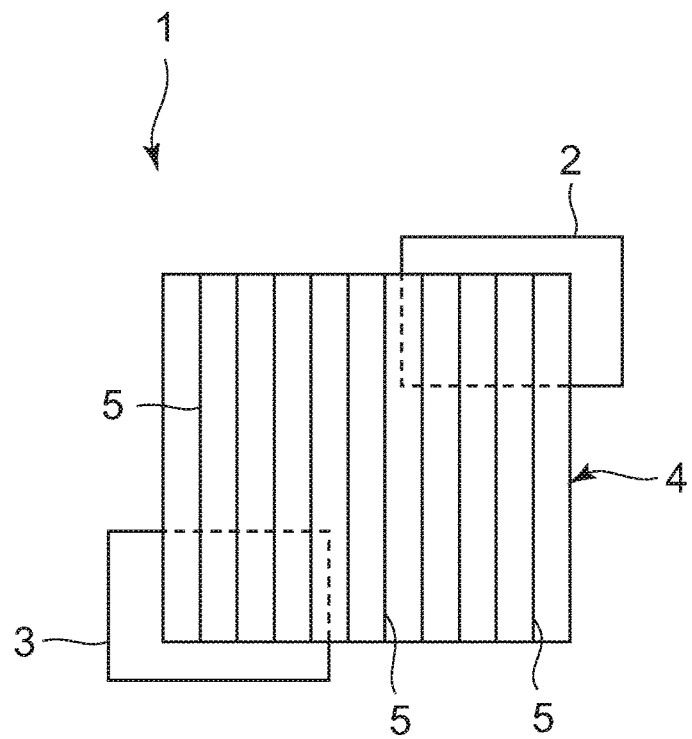
FIG. 1 is a diagram showing schematically a device provided with an electromagnetic interference suppression body according to a first embodiment of the present invention.

While the invention is susceptible of various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

First Embodiment

Referring to FIG. 1, a device 1 according to a first embodiment of the present invention is provided with a potential noise radiating source 2 possible to radiate a potential noise, a potential noise receiving portion 3 possible to receive the potential noise and an electromagnetic interference suppression body 4.

The potential noise radiating source 2 and the potential noise receiving portion 3 are, for example, two transmission lines provided on a circuit substrate, two parts mounted on a circuit substrate, a transmission line and a part or the like.

The electromagnetic interference suppression body 4 is made by binding flaky soft magnetic metal powder with a binding component and has a sheet-like shape. As the flaky soft magnetic metal powder, powder made of, Fe, a Fe—Si alloy, a Fe—Si—Al alloy, a Fe—Si—Cr alloy, an amorphous alloy or a nanocrystal alloy is exemplified. As shown in FIG. 1, the electromagnetic interference suppression body 4 is provided to straddle the potential noise radiating source 2 and the potential noise receiving portion 3.

Moreover, the electromagnetic interference suppression body 4 of the present embodiment is formed with a plurality of slits 5. There is no limitation with respect to an extending direction of the slit 5 in particular. Furthermore, the slits 5 need not be parallel to each other but may intersect each other. In addition, sides of polygons may be formed with the slits 5. When the electromagnetic interference suppression body 4 in which the plurality of the slits 5 are formed is provided to straddle the potential noise radiating source 2 and the potential noise receiving portion 3, spatial coupling between the potential noise radiating source 2 and the potential noise receiving portion 3 can be reduced.

Specifically, the slits 5 of the present embodiment are set so that an effective dielectric constant of the electromagnetic interference suppression body 4 in an in-plane direction is at most 500. When the effective dielectric constant of the electromagnetic interference suppression body 4 in the in-plane direction is at most 500, the coupling between the potential noise radiating source 2 and the potential noise receiving portion 3 can be reduced over a relatively wide frequency range. It is presumed that this is because an electric field induced in the in-plane direction of the electromagnetic interference suppression body 4 can be appropriately divided by the slits 5 and can suppress increase of the coupling due to the electric field. When the effective dielectric constant of the electromagnetic interference suppression body 4 in the in-plane direction is at most 100, the coupling between the potential noise radiating source 2 and the potential noise receiving portion 3 can be reduced in almost all of the frequency range.

It should be noted that, in the present embodiment, the effective dielectric constant of the electromagnetic interference suppression body 4 in the in-plane direction can be measured by a perturbation method. The perturbation method is described, for example, in paragraph 0002 of JPA H11-118732.

A depth of the slit 5 of the present embodiment is at least 83% of a thickness of the electromagnetic interference suppression body 4. The slit 5 with the depth less than 83% is small in the dividing effect for the electric field. Accordingly, it is preferable that the depth is at least 83%. The depth of the slit 5 may be 100%. In a case, especially, where the slits 5 are horizontally or vertically formed across the electromagnetic interference suppression body 4, the electromagnetic interference suppression body 4 is divided into small pieces by the slits 5 having the depth of 100%. In such a case, the small pieces of the electromagnetic interference suppression body 4 should be maintained in the divided and arranged state by affixing them to a base member of an adhesive tape, such as a double-faced tape.

A recommended width of the slit 5 is at least 0.02 mm and at most 0.4 mm. This is because it is difficult to obtain the dividing effect for the electric field when the width is smaller than 0.02 mm and because the effect of reducing the coupling between the potential noise radiating source 2 and the potential noise receiving portion 3 is reduced when the width is larger than 0.4 mm. It is preferable that the width of the slit 5 is at least 0.05 mm in order to reduce the coupling more effectively.

In a case where a pitch of the slits 5 is represented by P while the thickness of the electromagnetic interference suppression body 4 is represented by t, it is desirable that a ratio P/t is at least 1 and at most 80. When the ratio P/t is smaller than 1, fabrication is difficult. Moreover, it is necessary to consider a relation between the direction of the slits 5 and an arrangement of the potential noise radiating source 2 and the potential noise receiving portion 3 when the ratio P/t is smaller than 1. This is because, for example, there is a case, according to the direction of the slits 5 and the arrangement of the potential noise radiating source 2 and the potential noise receiving portion 3, where a demagnetizing field strongly affects a magnetic field component in the in-plane direction of the electromagnetic interference suppression body 4 when a magnetic field is produced from the potential noise radiating source 2, and effective magnetic permeability is reduced, and then a noise suppression effect by magnetic lose is reduced. It is preferable that the aforementioned ratio P/t is at most 50 in order to suppress effectively the coupling between the potential noise radiating source 2 and the potential noise receiving portion 3.

The slits 5 of the present embodiment are in a state formed by cutting, i.e. air layers. In other words, a dielectric constant of the slit 5 is 1. The slit 5 may be embedded by a dielectric to maintain a size and a shape thereof. It is, however, preferable that the dielectric constant of the slit 5 is at least 1 and at most 20 because the effect of dividing the electric field is reduced when the dielectric constant of the slit 5 is greater than 20.

Example 1

Figure 2:
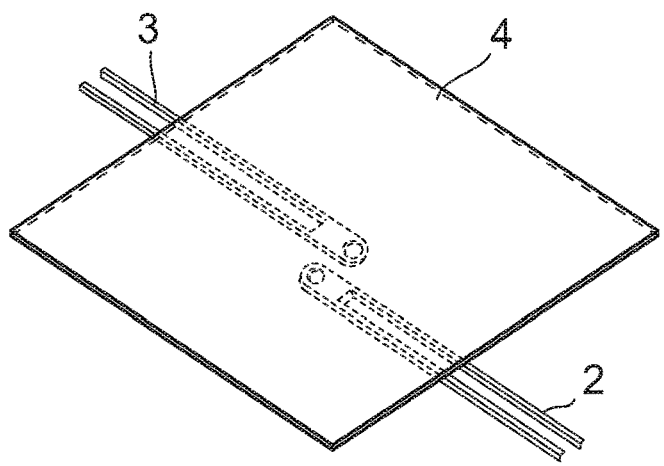
FIG. 2 is a diagram showing a measurement system in an example 1 of the present invention.
Figure 3:
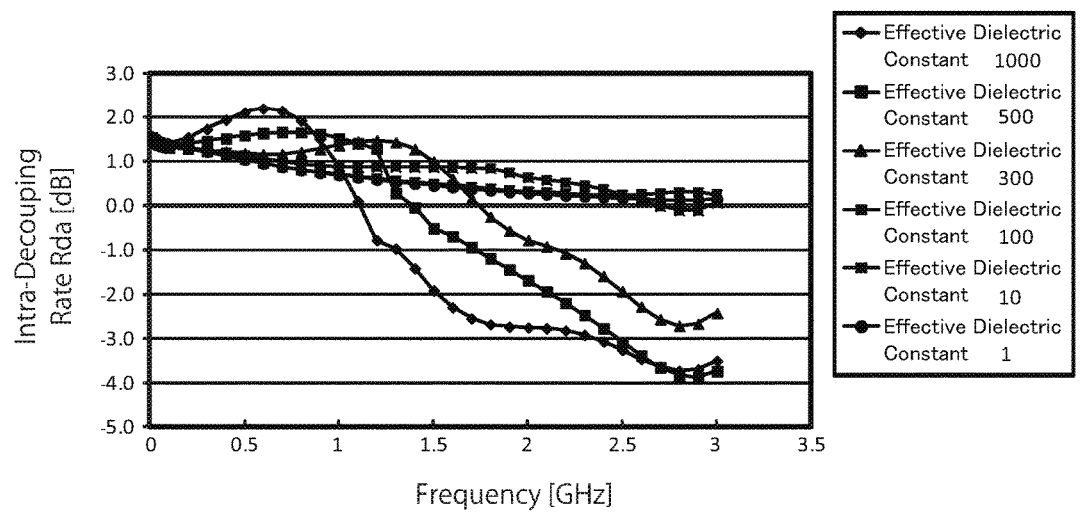
FIG. 3 is a graph showing an effect of a device according to the example 1 of the present invention.

In order to confirm effects of the invention, simulations were executed using a three-dimensional electromagnetic simulator. On the occasion when the simulations were executed, an evaluation model shown in FIG. 2 was assumed. The electromagnetic interference suppression body 4 was provided to straddle two loop coils, one of them was possible to function as the potential noise radiating source 2 and the other was possible to function as the potential noise receiving portion 3, and interference between the two loop coils was calculated. A graph as a result is shown in FIG. 3. In the graph, an intra-decoupling rate Rda dB has a positive value (Rda>0) in a case where the coupling between the potential noise radiating source 2 and the potential noise receiving portion 3 is suppressed.

Referring to FIG. 3, in a case where the effective dielectric constant is 500, it can be understood that the intra-decoupling rate Rda has positive values within a frequency range until about 1.5 GHz. In addition, in a case where the effective dielectric constant is 100, the intra-decoupling rate Rda has positive values in almost all of a frequency range until 3 GHz. That is, in the case where the effect dielectric constant is 100, in almost all of the frequency range until 3 GHz, the coupling between the potential noise radiating source 2 and the potential noise receiving portion 3 can be reduced.

Second Embodiment

Figure 4:
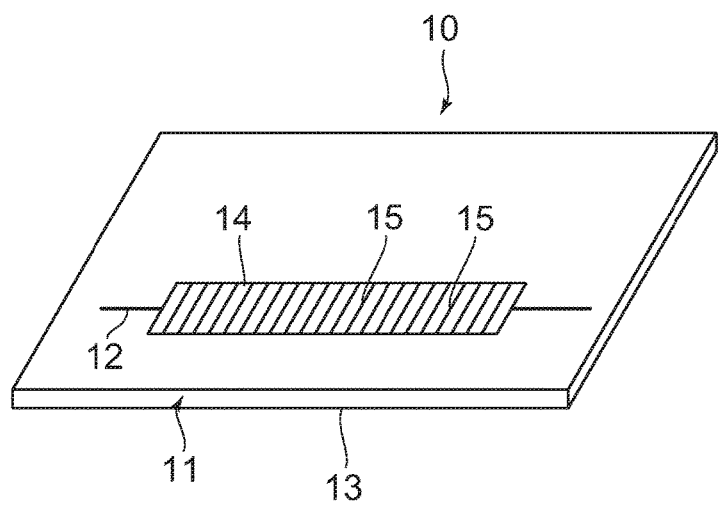
FIG. 4 is a perspective view showing schematically a device (a circuit substrate) provided with an electromagnetic interference suppression body according to a second embodiment of the present invention.

Referring to FIG. 4 a circuit substrate (device) 10 according to a second embodiment of the present invention is provided with a substrate body 11 and an electromagnetic interference suppression body 14.

The substrate body 11 according to the present embodiment is a double-sided bilayer substrate, which has two main surfaces. One of the main surfaces is formed with a signal line 12 thereon while the other of the main surfaces is formed with a ground layer 13 thereon. In detail, the ground layer 13 is not formed in two regions which are positioned to interpose a region positioned directly below the signal line 12 on the other of the main surfaces of the substrate body 11. That is, the ground layer 13 does not form everywhere on the other of the main surfaces of the substrate body 11. However, the present invention is not limited thereto. The ground layer 13 may be formed everywhere on the other of the main surfaces of the substrate body 11 (may be a solid pattern), or have any other pattern. Moreover, the substrate body 11 of the present invention is not limited to the double-sided bilayer substrate but may be a substrate having any other structure.

The electromagnetic interference suppression body 14 is composed as with that of the first embodiment. That is, the electromagnetic interference suppression body 14 is made by biding flaky soft magnetic metal powder with a binding component and has a sheet-like shape. As the flaky soft magnetic metal powder, powder made of, Fe, a Fe—Si alloy, a Fe—Si—Al alloy, a Fe—Si—Cr alloy, an amorphous alloy or a nanocrystal alloy is exemplified. As illustrated, the electromagnetic interference suppression body 14 of the present embodiment is disposed on the signal line 12 of the substrate body 11.

The electromagnetic interference suppression body 14 according to the present embodiment is formed with a plurality of slits 15 so that an effective dielectric constant in an in-plane direction becomes 500 or less. When the effective dielectric constant of the electromagnetic interference suppression body 14 in the in-plane direction is at most 500, radiated noise can be suppressed to at worst a level equal to that in a case where the electromagnetic interference suppression body 14 is not affixed. It is presumed that this is because an effect of dividing electric field is small when the dielectric constant is larger than 500, and therefore a suppression effect for the radiated noise cannot be obtained, whereas the electric field is appropriately divided when the dielectric constant is 500 or less, and, consequently, the radiated noise is suppressed. Furthermore, when the effective dielectric constant of the electromagnetic interference suppression body 14 in the in-plane direction is 300 or less, the radiated noise can be suppressed over a wide frequency range in comparison with the case where the electromagnetic interference suppression body 14 is not affixed. That is, when many slits 15 are formed so that the effective dielectric constant of the electromagnetic interference suppression body 14 in the in-plane direction becomes 300 or less, not only suppression of transmission noise but also suppression of the radiated noise can be achieved over the wide frequency range at the same time.

Specifically, the slits 15 of the present embodiment are set so that the effective dielectric constant of the electromagnetic interference suppression body 14 in the in-plane direction becomes 100 or less. When the effective dielectric constant of the electromagnetic interference suppression body 14 in the in-plane direction is 100 or less, the radiated noise can be suppressed in about all of frequency range in comparison with the case where the electromagnetic interference suppression body 14 is not affixed. That is, when the many slits 15 are formed so that the effective dielectric constant of the electromagnetic interference suppression body 14 in the in-plane direction becomes 100 or less, not only the suppression of the transmission noise but also the suppression of the radiated noise can be achieved over about all of the frequency range.

It should be noted that, also in the present embodiment, the effective dielectric constant of the electromagnetic interference suppression body 14 in the in-plane direction can be measured by the aforementioned perturbation method. The perturbation method is described, for example, in the paragraph 0002 of JPA H11-118732.

A depth of the slit 15 of the present embodiment is at least 83% of a thickness of the electromagnetic interference suppression body 14. The slit 15 with the depth less than 83% is small in the dividing effect for the electric field. Accordingly, it is preferable that the depth is at least 83%. The depth of the slit 15 may be 100%. In a case, especially, where the slits 15 are horizontally or vertically formed across the electromagnetic interference suppression body 14, the electromagnetic interference suppression body 14 is divided into small pieces by the slits 15 having the depth of 100%. In such a case, the small pieces of the electromagnetic interference suppression body 14 should be maintained in the divided and arranged state by affixing them to a base member made of an adhesive tape, such as a double-faced tape.

A recommended width of the slit 15 is at least 0.02 mm and at most 0.4 mm. This is because it is difficult to obtain the dividing effect for the electric field when the width is smaller than 0.02 mm and because the suppression effect for the radiated noise is reduced when the width is larger than 0.4 mm. It is preferable that the width of the slit 15 is at least 0.05 mm in order to suppress the radiated noise more effectively.

In a case where a pitch of the slits 15 is represented by P while the thickness of the electromagnetic interference suppression body 14 is represented by t, it is desirable that a ratio P/t is at least 1 and at most 80. When the ratio P/t is smaller than 1, fabrication is difficult. Moreover, it is necessary to consider a relation between the direction of the slits 15 and a direction of the signal line 12 when the ratio P/t is smaller than 1. This is because, for example, in a case where the slits 15 are formed to extend in about parallel with the signal line 12, demagnetizing field strongly affects a component in the in-plane direction of the electromagnetic interference suppression body 14 when a magnetic field is produced by current flowing on the signal line 12, and effective magnetic permeability is reduced, and then a noise suppression effect by magnetic lose is reduced. It is preferable that the aforementioned ratio P/t is at most 50 in order to suppress the radiated noise effectively.

The slits 15 of the present embodiment are in a state formed by cutting, i.e. air layers. In other words, a dielectric constant of the slit 15 is 1. The slit 15 may be embedded by a dielectric to maintain a size and a shape thereof. It is, however, preferable that the dielectric constant of the slit 15 is at least 1 and at most 20 because the effect of dividing the electric field is reduced when the dielectric constant of the slit 15 is greater than 20.

It should be noted that though just the slits 15 extending a direction orthogonal to the signal line 12 are formed in the electromagnetic interference suppression body 14 in the aforementioned embodiment, the present invention is not limited thereto. The direction in which the slits 15 extend may intersect with or be in parallel to the signal line 12. Moreover, the slits 15 are not limited to slits parallel to one another. The slits 15 may intersect with one another to form a lattice of polygons.

Example 2

In order to confirm effects of the invention, simulations were executed using a three-dimensional electromagnetic simulator. One end of the signal line 12 was supplied with electric power of 1 W while the other end of the signal line 12 was terminated by a terminating resistance of 75 ohms. Radiated noise (electric field) at a distant point distant from the signal line by 3 m was calculated with changing the effective dielectric constant of the electromagnetic interference suppression body 14 in the in-plane direction. In addition to that, variation, against frequency, of difference between the case mentioned above and the case where the electromagnetic interference suppression body 14 was not affixed was plotted on a graph. That is, the difference is 0 dB in the case of causing radiated noise having the same level as that of the radiated noise caused in the case where the electromagnetic interference suppression body 14 is not affixed. The graph as the result is shown in FIG. 5.

Figure 5:
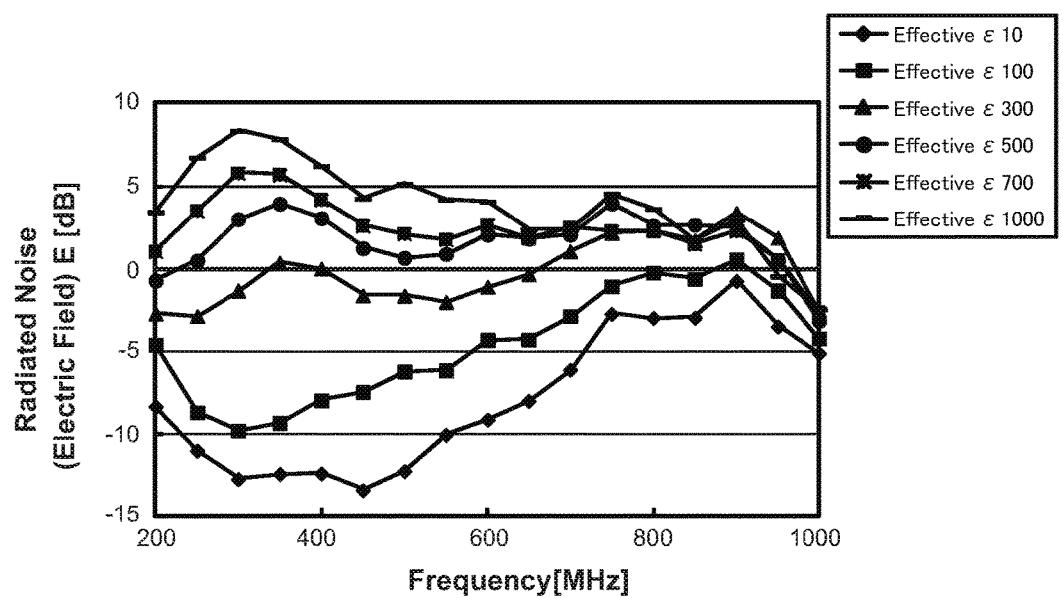
FIG. 5 is a graph showing an effect of the electromagnetic interference suppression body according to an example 2 of the present invention.

Referring to FIG. 5, in the case where the effective dielectric constant is 1000, the radiated noise becomes too large in comparison with the case where the electromagnetic interference suppression body 14 is not affixed. In the case where the effective dielectric constant is 500, however, the radiated noise is slightly increased in comparison with the case where the electromagnetic interference suppression body 14 is not affixed but suppressed to a level adequate for practical applications. Furthermore, in the case where the effective dielectric constant is 300, the radiated noise can be suppressed over a wide frequency range in comparison with the case where the electromagnetic interference suppression body 14 is not affixed. In the case where the effective dielectric constant is 100, the radiated noise can be suppressed over about all of the frequency range in comparison with the case where the electromagnetic interference suppression body 14 is not affixed.

The present invention is based on Japanese patent applications of JP2014-255516 and JP2014-255517 filed before the Japan Patent Office on Dec. 17, 2014, the content of which is incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

REFERENCE SIGNS LIST

1 Device
2 Potential Noise Radiating Source
3 Potential Noise Receiving Portion
4 Electromagnetic Interference Suppression Body
5 Slit
10 Circuit Substrate (Device)
11 Substrate Body
12 Signal Line
13 Ground Layer
14 Electromagnetic Interference Suppression Body
15 Slit

The invention claimed is:
1. A device comprising:
a potential noise radiating source which may radiate a potential noise;
a potential noise receiving portion which is not directly connected to the potential noise radiating source, wherein the potential noise receiving portion is in a position at which the potential noise receiving portion may receive the potential noise; and
an electromagnetic interference suppression body, wherein:
the electromagnetic interference suppression body is made by binding flaky soft magnetic metal powder with a binding component and has a sheet-like shape;
the electromagnetic interference suppression body is formed with a plurality of slits; and the electromagnetic interference suppression body is provided to straddle the potential noise radiating source and the potential noise receiving portion.

2. The device as recited in claim 1, wherein the slits are formed so that an effective dielectric constant of the electromagnetic interference suppression body in an in-plane direction is at most 500.

3. The device as recited in claim 2, wherein the effective dielectric constant of the electromagnetic interference suppression body in the in-plane direction is at most 100.

4. The device as recited in claim 1, wherein a depth of each of the slits is at least 83% of a thickness of the electromagnetic interference suppression body.

5. The device as recited in claim 1, wherein a width of each of the slits is at least 0.02 mm and at most 0.4 mm.

6. The device as recited in claim 5, wherein the width of each of the slits is at least 0.05 mm.

7. The device as recited in claim 1, wherein a ratio P/t of a pitch P of the slits to a thickness t of the electromagnetic interference suppression body is at least 1 and at most 80.

8. The device as recited in claim 7, wherein the ratio P/t is at most 50.

9. The device as recited in claim 1, wherein a dielectric constant of the slit is at least 1 and at most 20.

* * * * *